(12) United States Patent
Mercanzini

(10) Patent No.: US 6,745,567 B1
(45) Date of Patent: Jun. 8, 2004

(54) SYSTEM AND METHOD FOR POSITIONAL MOVEMENT OF MICROCOMPONENTS

(75) Inventor: Andre L. Mercanzini, Toronto (CA)

(73) Assignee: Zyvex Corporation, Richardson, TX (US)

( * ) Notice: Subject to any disclaimer, the term of this patent is extended or adjusted under 35 U.S.C. 154(b) by 175 days.

(21) Appl. No.: 10/033,011

(22) Filed: Dec. 28, 2001

(51) Int. Cl.[7] .............................................. F01B 29/10
(52) U.S. Cl. ........................................ 60/527; 60/528
(58) Field of Search ......................... 60/527, 528, 529

(56) References Cited

U.S. PATENT DOCUMENTS

| | | | |
|---|---|---|---|
| 4,740,410 A | | 4/1988 | Muller et al. |
| 5,506,175 A | * | 4/1996 | Zhang et al. .................. 438/20 |
| 5,529,279 A | * | 6/1996 | Beatty et al. .................. 251/11 |
| 5,563,343 A | * | 10/1996 | Shaw et al. ............... 73/514.18 |
| 5,619,177 A | * | 4/1997 | Johnson et al. ............. 337/140 |
| 5,645,684 A | | 7/1997 | Keller |
| 5,660,680 A | | 8/1997 | Keller |
| 5,914,801 A | | 6/1999 | Dhuler et al. |
| 5,962,949 A | | 10/1999 | Dhuler et al. |
| 6,057,520 A | * | 5/2000 | Goodwin-Johansson .... 200/181 |
| 6,137,206 A | | 10/2000 | Hill |
| 6,333,583 B1 | * | 12/2001 | Mahadevan et al. ........ 310/306 |

OTHER PUBLICATIONS

Reid, J. Robert et al., "Automated Assembly of Flip–Up Micromirrors," *Transducers '97*, 1997, 347–350 Int'l Conf. on Solid–State Sensors and Actuators, Chicago, Jun. 16–19.

Luntz, Jonathan E. et al., "Closed–Loop Operation of Actuator Arrays," *IEEE* 2000, Int'l Conf. Robotics and Automation, San Francisco, Apr. 3666–3672.

Suh, John W. et al., "Organic thermal and electrostatic ciliary microactuator array for object manipulation," *Sensors and Actuators* A 58 1977 51–60.

Bohringer, Karl–Friedrich et al., "Vector Fields for Task–level Distributed Manipulation: Experiments with Organic Micro Actuator Arrays," *IEEE* 1997 1779–1786 Int'l Conf. Robotics and Automation, Albuquerque.

Bohringer, Karl–Friedrich et al., "Single–Crystal Silicon Actuator Arrays for Micro Manipulation Tasks," *IEEE* 1996.

Will, Peter, "MEMS and Robotics: Promises and Problems," *IEEE* 2000 Int'l Conf. Robotics and Automation, San Francisco, Apr. 938–946.

Liu, Wenheng et al., "Parts Manipulation on an Intelligent Motion Surface," *IEEE* 1995.

Fan, Li et al., *Self–Assembled Microactuated XYZ stages for Optical Scanning and Alignment,* 1997 International Conference on Solid–State Sensors and Actuators, Chicago, Jun. 16–19, 1997, pp. 319–322.

Akiyama, Terunobu et al., *Scratch Drive Actuator with Mechanical Links for Self–Assembly of Three–Dimensional MEMS,* Journal of Microelectromechanical Systems, vol. 6, No. 1, Mar. 1997, pp. 10–17.

(List continued on next page.)

*Primary Examiner*—Hoang Nguyen
(74) *Attorney, Agent, or Firm*—Haynes and Boone, LLP

(57) ABSTRACT

Systems and methods are disclosed which provide controlled positioning of a microcomponent in a plurality of directions for which control is provided independently. Preferably such controlled translation is provided by a MEMS micro-translation system having a relatively large range of motion, such as bi-directionally along an X axis, which is adapted for production using monolithic manufacturing processes without requiring post-process manufacturing steps. Preferred embodiments provide independent microcomponent translation along multiple axes, e.g., provide translation along an X axis, a Y axis, and/or a rotational axis.

71 Claims, 9 Drawing Sheets

OTHER PUBLICATIONS

Linderman, Ryan J. et al., *Optimized Scratch Drive Actuator for Tethered Nanometer Positioning of Chip–Sized Components*, Solid–State Sensor and Actuator Workshop, NSF Center for Advanced Manufacturing and Packaging of Microwave, Optical, and Digital Electronics, University of Colorado at Boulder, CO.

Ebefors, Thorbjorn, thesis entitled *Polyimide V–Groove Joints for Three–Dimensional Silicon Transducers—exemplified through 30D turbulent gas flow sensor and micro–robotic devices*, Chapter 3, p. 24. figures a) and b).

* cited by examiner

US 6,745,567 B1

SYSTEM AND METHOD FOR POSITIONAL MOVEMENT OF MICROCOMPONENTS

RELATED APPLICATIONS

The present application is related to concurrently filed, copending, and commonly assigned U.S. patent application Ser. No. [50767-P015US-10/106,749] entitled "System and Method for Handling Microcomponent Parts for Performing Assembly of Micro-Devices" and commonly assigned U.S. patent applications Ser. No. 09/569,330 now U.S. Pat. No. 6,510,359 entitled "Method and System for Self-Replicating Manufacturing Stations," filed May 11, 2000, and Ser. No. 09/616,500, entitled "System and Method for Constraining Totally Released Microcomponents," filed Jul. 14, 2000, the disclosures of which are hereby incorporated herein by reference.

TECHNICAL FIELD OF THE INVENTION

The invention is generally related to providing controllable translation of microcomponents and, more particularly, to providing independent translation of microcomponents in a plurality of directions.

BACKGROUND OF THE INVENTION

There are many applications in which it may be desirable to provide controlled positioning of a microcomponent. For example, in optical technologies it may be desired to provide controlled movement of a lens with respect to a light source, such as a laser emitter, to produce desired light emission patterns. Similarly, it may be desired to provide controlled movement of an optical fiber end in order to properly interface with a light source.

Accordingly, various apparatuses, typically referred to as microelectromechanical systems (MEMS), have been developed to provide translation of a specimen in particular directions. For example, micro-translation systems have been developed in which a microcomponent stage, upon which a specimen may be placed or mounted, is operatively coupled to an actuator to provide controlled movement of the stage and, accordingly, translation of the specimen. Multiple actuators may be disposed in such a micro-translation system to provide a configuration in which motion in multiple directions may be provided, such as along both the X and Y axes.

One such micro-translation system utilizes a plurality of thermal actuators (also referred to as heatuators) for in-plane translation. Directing attention to FIG. 1, micro-translation system 100 is shown including thermal actuators 110 and 120 directly coupled to stage 130 by flexures. Thermal actuators 110 and 120 are oriented to provide translation of stage 130, and components placed thereon, along both the X and Y axes. Specifically, thermal actuator 110 is coupled to stage 130 by connecting member 131 and provides translation of stage 130 substantially along the X axis when hot-arm 111 is expanded by Joule heating and anchor 115, cold-arm 112, flexure 113, and anchor 115 cause transfer of torsional energy to connecting member (flexure) 131. Similarly, thermal actuator 120 is coupled to stage 130 by connecting member 132 and provides translation of stage 130 substantially along the Y axis when hot-arm 121 is expanded by Joule heating and anchor 124, cold-arm 122, flexure 123, and anchor 125 cause transfer of torsional energy to connecting member (flexure) 132.

It should be appreciated, however, that micro-translation systems of the prior art utilizing thermal actuators in such a configuration suffer from several disadvantages. One such disadvantage is that the motion actively imparted is unidirectional. Moreover, attempts to provide bi-directional motion using such micro-translation systems generally require substantial post-processing manufacturing steps, such as to electronically isolate the thermal actuators associated with different directions of motion, thereby making such systems impossible to fully implement with monolithic production processes. Additionally, the range of motion associated with the use of thermal actuators is limited to approximately 5% of the overall length of the actuator. A further disadvantage is that translation provided by the micro-translation system along either axis is not independent of translation along the other axis. For example, translation of stage 130 provided by thermal actuator 120 along the Y axis will result in some translation of stage 130 along the X axis due to the torsional distortion of thermal actuator 120. This movement along the unselected axis is further aggravated due to the connection of connecting member 131 and thermal actuator 110 thereto.

Other known micro-translation systems utilize indirect translation mechanisms. Directing attention to FIG. 2, unidirectional micro-translation system 200 is shown utilizing indirect drive means. In the system of FIG. 2, a translation mechanism is disposed on each side of, and in the same plane with, stage 230 to controllably engage stage 230 and provide translation in a predetermined direction. Specifically, translation mechanism 210 includes actuator banks 211 and 212 coupled to lateral translation gear 231 by connecting arms 214 and 215, respectively. Similarly, translation mechanism 220 includes actuator banks 221 and 222 coupled to lateral translation gear 232 by connecting arms 224 and 225, respectively. Actuator banks 211, 212, 221, and 222 may be comprised of an array of thermal actuators, such as are shown in detail above in FIG. 1, and are oriented to provide translation of stage 230, and components placed thereon, along the X axis by causing lateral translation gears 231 and 232 to engage corresponding racks 233 and 234 using Y axis movement associated with actuator banks 211 and 221. Thereafter, movement along the X axis is provided by lateral movement of engaged translation gears 231 and 232 causing corresponding movement in racks 233 and 234, and thus stage 230, using X axis movement associated with actuator banks 212 and 222. Lateral translation gears 231 and 232 may then be disengaged from corresponding racks 233 and 234, again using Y axis movement associated with actuators 211 and 221, and reengage with corresponding racks 233 and 234 at a different point, using X axis movement associated with actuators 212 and 222, for further movement of stage 230.

Micro-translation systems of the prior art utilizing the above described indirect thermal actuator drive mechanisms suffer from several disadvantages. For example, although the range of motion is appreciably improved over that of the direct thermal actuator drive mechanism of FIG. 1, the motion actively imparted remains unidirectional and, the only one direction of movement is provided. Moreover, attempts to provide bi-directional motion using such micro-translation systems generally require substantial post-processing manufacturing steps, such as to electronically isolate the actuator banks associated with different directions of motion, thereby making such systems impossible to fully implement with monolithic production processes. Additionally, prior art configurations of such micro-translation systems provide translation of a stage along a single axis and, therefore, no configuration has been proposed to provide movement along two axes which may be produced without substantial-post production manufacturing steps, i.e., no configuration is known in the prior art which may be produced using a monolithic manufacturing process.

Still other prior art micro-translation systems have implemented scratch drive actuators (SDAs) to provide translation of a stage. Directing attention to FIG. 3, one configuration of a SDA as is well known in the art is shown as SDA 310. Specifically, SDA 310 comprises plate 311, torsion mounts 312, and bushing 313. For operation, SDA 310 is disposed upon a substrate such that a conducting layer, such as conducting layer 322, is in juxtaposition with plate 311 and an insulating layer, such as insulating layer 321, is disposed therebetween.

Operation of SDA 310 is illustrated in FIGS. 4A–4C. Specifically, FIG. 4A shows voltage source 410 coupled to plate 311 and conducting layer 322 without any voltage applied thereto. However, as shown in FIG. 4B, a priming voltage may be provided by voltage source 410 and an electromagnetic field associated therewith causes deflection of plate 311 such that its distal end is drawn toward conducting layer 322. As shown in FIG. 4C, the voltage provided by voltage source 410 may be increased to that of a stepping voltage such that plate 311 is more fully drawn toward conducting layer 322 causing bushing 313 to be displaced such that a distal end thereof steps forward distance "S". Reducing the voltage provided by voltage source 410 to the priming voltage or below causes plate 311 to move forward distance "S" as bushing 313 is again righted, i.e., SDA 310 returns to a orientation as shown in FIGS. 4A or 4B.

Although SDAs are generally useful in providing a relatively large range of linear motion, implementation of such actuators is still fraught with problems. For example, the use of such SDAs has generally required the use of a wire tether to provide activating potential to the SDA plate while accommodating the motion of the SDA. Moreover, although a bank of SDAs may be produced using a monolithic manufacturing process, all such SDAs have heretofore been electrically connected, causing each such SDA to be activated simultaneously. Accordingly, true bi-directional implementations of SDAs have not been provided using monolithic manufacturing processes as the SDAs of each such direction have been electrically connected and thus operable simultaneously. In order to provide SDAs which are independently operable in multiple directions, prior art implementations have required substantial post-processing manufacturing steps, such as to electronically isolate the SDAs associated with different directions of motion, thereby making such systems impossible to fully implement with monolithic production processes.

Accordingly, a need exists in the art for systems and methods to provide a relatively large range of motion in multiple directions with respect to a microcomponent. A need exists in the art for such multiple directions of motion to include bi-directional motion and/or motion along different axes.

Moreover, a need exists in the art for systems and methods to provide a relatively large range of motion which may be substantially produced using monolithic manufacturing processes.

BRIEF SUMMARY OF THE INVENTION

The present invention is directed to systems and methods which provide controlled positioning of a microcomponent in a plurality of directions for which control is provided independently. Preferably, the present invention provides a relatively large range of motion for positioning a specimen or other component for subsequent use or manipulation, such as for performing a manufacturing step.

Preferred embodiments of the present invention provide a MEMS micro-translation system providing a relatively large range of motion, such as bi-directionally along an X axis, Which is adapted for production using monolithic manufacturing processes without requiring post-process manufacturing steps. Specifically, monolithic manufacturing of preferred embodiment micro-translation systems provide for operation of the micro-translation system throughout a relatively large range of motion without requiring post-processing manufacturing steps, i.e., without employing manufacturing steps with respect to a monolithically produced micro-translation system after its removal from the monolithic sustrate (after "breaking silicon").

For example, a plurality of actuator banks of a preferred embodiment monolithically produced micro-translation systems are provided with independent control, such as for providing independent motion in a plurality of different directions, without requiring a post-processing step, such as affixing actuator banks to a non-conductive stage or otherwise providing electrical isolation between actuators. Additionally or alternatively, preferred embodiments of the present invention are adapted to be controlled throughout such relatively large ranges of motion without the post-processing application of wire tethers thereto.

Preferred embodiments of the present invention provide independent microcomponent translation along multiple axes, e.g., provide translation along an X axis and a Y axis. Embodiments of the invention preferably utilize a configuration of actuators in which motion imparted by at least one actuator results in corresponding movement of an independently controllable actuator while the independently controllable actuator remains inactive. For example, a preferred embodiment implementation of the present invention provides a monolithically produced micro-translation system in which actuators are disposed in multiple device units, such that an actuator of a secondary device unit, for providing movement along a first axis, is moved along a second axis by operation of an actuator of a primary device unit.

Accordingly, a technical advantage of the present invention is that motion in multiple directions, e.g., bi-directionally and/or along different axes, is provided with independent control. Moreover, a further technical advantage of the present invention is that such motion may be provided throughout a relatively large range.

A still further technical advantage is that micro-translation systems of the present invention are preferably adapted for use of monolithic manufacturing processes in their production and, thus, eliminate or otherwise minimize the use of post-process manufacturing steps.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 5A:
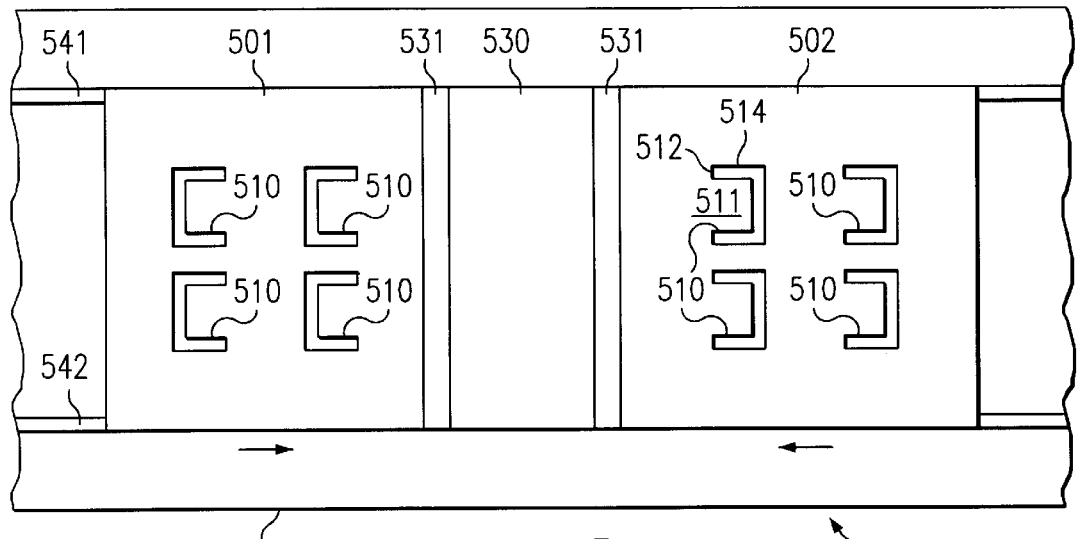
FIG. 5A shows a plan view of a bi-directional micro-translation system of the present invention.

Directing attention to FIG. 5A, a plan view of a bi-directional micro-translation system of the present invention adapted to provide a relatively large range of movement, such as motion in excess of 50 microns or motion to a substantially unlimited distance, is shown as micro-translation system 500. Micro-translation system 500 of the illustrated embodiment includes actuator arrays 501 and 502 in communication with stage 530 (collectively a device unit) to controllably provide movement thereof. Accordingly, a specimen or microcomponent may be placed upon or otherwise put in communication with stage 530 for controlled translation, such as to provide positioning for a manufacturing or other process.

According to preferred embodiments, various actuators are independently controllable to thereby allow selection of a direction of movement of a micro-translator system of the present invention. For example, micro-translation system 500 of the illustrated embodiment includes two actuator banks which are independently controllable to provide controlled movement of stage 530 in both the +X and –X directions. Specifically, scratch drive actuators (SDAs) 510 of actuator array 501 are preferably configured to provide motion in a first direction, such as the +X direction, while SDAs 510 of actuator array 502 are preferably configured to provide motion in a second direction, such as the –X direction.

Independent control of actuators of the present invention is preferably provided through electrical isolation of various ones of the actuators. For example, although disposed upon a same device layer, SDAs 510 of actuator array 501 are preferably electrically isolated from SDAs 510 of actuator array 502, such as through the use of insulating members 531 disposed therebetween. Accordingly, a control signal may be provided to SDAs 510 of actuator array 501, such as via signal path 541, while SDAs 510 of actuator array 502 remain inactive to thereby provide movement of stage 530 in the +X direction. Similarly, a control signal may be provided to SDAs 510 of actuator array 502, such as via signal path 542, while SDAs 510 of actuator array 501 remain inactive to thereby provide movement of stage 530 in the –X direction.

Figure 3:
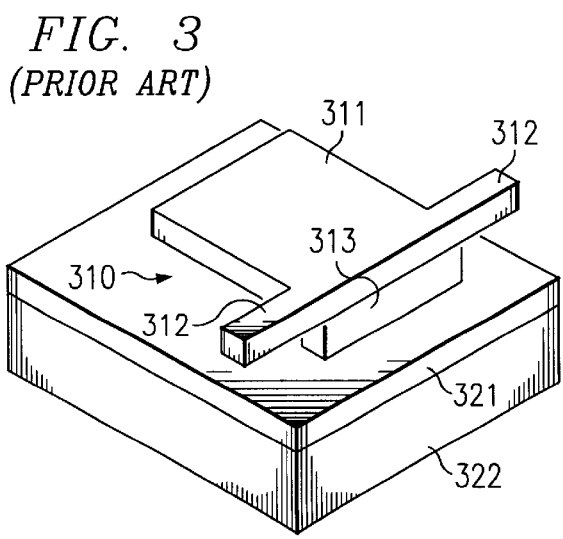
FIG. 3 shows a configuration of a prior art scratch drive actuator.
Figure 4A:
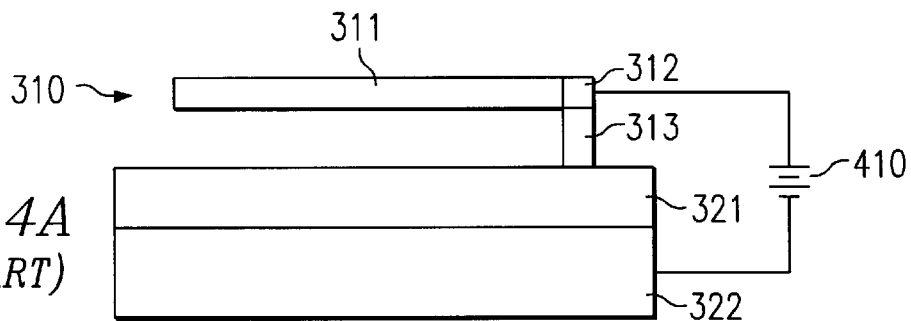
FIGS. 4A–4C illustrate operation of the scratch drive actuator of FIG. 3.
Figure 4B:
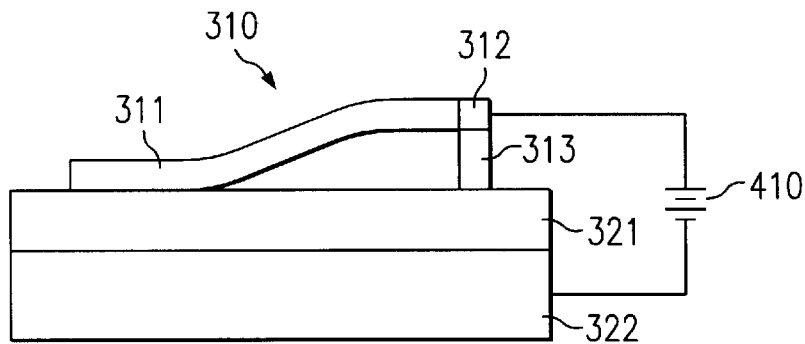
Figure 4C:
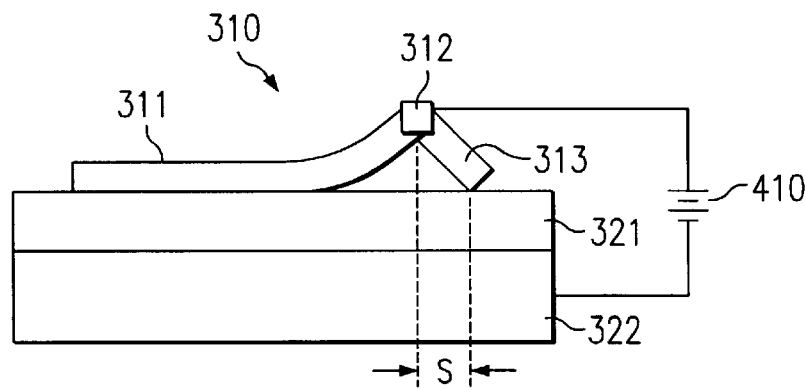

SDAs 510 are preferably configured substantially as shown in FIG. 3 and, therefore, operate substantially as shown in FIGS. 4A–4C. Accordingly, preferred embodiment SDAs 510 include plate 511 (FIG. 5A) and bushing 513 (FIG. 5B) coupled thereto. Plates 511 of the illustrated embodiment are coupled to actuator arrays 501 and 502 by torsion mounts 512. For example, plates 511 of SDAs 510 may be defined from a solid layer of conductive material from which actuator array 501 and/or actuator array 502 are made by etching, or otherwise removing, material of the layer in order to define three sides of plates 511. Accordingly, torsion mounts 512 may be defined by, and substantially integral to, the interface of plates 511 and actuator arrays 501 and 502.

In operation according to a preferred embodiment, a voltage, as may be provided by voltage source such as voltage source 410 of FIGS. 4A–4C, is applied across plates 511 of the SDAs to be activated and a corresponding substrate conductor, such as conductor 522. For example, a first signal of the voltage source may be applied to plates 511 of actuator array 501 while a corresponding second signal of the voltage source is applied to conductor 522 to energize SDAs substantially as described above with respect to FIGS. 4A–4C. Preferably, insulating layer 521 is provided to electrically isolate plates 511 from substrate 522 during operation of SDAs 510.

Preferred embodiments of the invention are adapted to accommodate the application of control signals to selected components of micro-translation system 500 throughout the movement range thereof. Accordingly, the illustrated embodiment includes signal paths 541 and 542 and brushes 551 and 552 associated with actuator arrays 501 and 502, respectively. Signal paths 541 and 542 are preferably laid down on substrate 520 to correspond with operable movement of micro-translation system 500, it being appreciated that in the illustrated embodiment insulating layer 521 provides electrical isolation of substrate 522 and signal paths 541 and 542 as well as providing an insulating layer for operation of SDAs 510. Brush 551 is preferably in electrical communication with actuator array 501 and is preferably disposed such that brush 551 is in electrical communication with at least a portion of signal path 541 throughout operational movement of micro-translation system 500. Similarly, brush 552 is preferably in electrical communication with actuator array 502 and is preferably disposed such that brush 552 is in electrical communication with at least a portion of signal path 542 throughout operational movement of micro-translation system 500.

The first signal of a voltage source may be applied to plates 511 of actuator array 501 throughout the operational movement of micro-translation system 500 by applying the signal to signal path 541. Likewise, the first signal of a voltage source may be applied to plates 511 of actuator array 502 throughout the operational movement of micro-translation system 500 by applying the signal to signal path 542. Accordingly, micro-translation system 500 may be controlled to move in either direction along the route of signal paths 541 and 542 for substantially limitless distances.

It should be appreciated that micro-translation system 500 of the illustrated embodiment is well suited for production using monolithic production processes. For example, micro-translation system 500 is configured so as to require no post-process manufacturing steps, such as to provide electrical isolation between various ones of the actuators, to couple actuator banks to a stage, and/or to connect a wire tether thereto to provide control signals throughout the operational movement of the micro-translation system.

Figure 6:
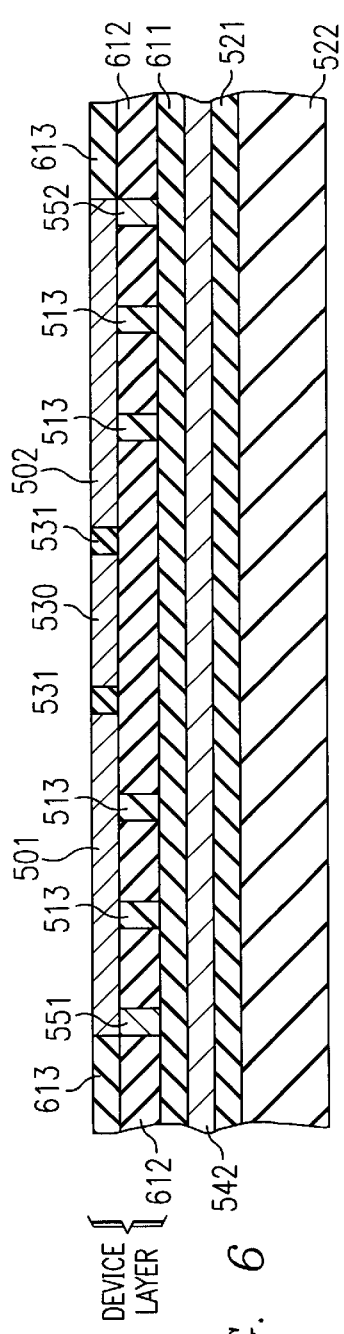
FIG. 6 shows an illustrative monolithic lay-up which might be used in manufacturing the bi-directional micro-translation system of FIGS. 5A and 5B.

Directing attention to FIG. 6, an exemplary monolithic lay-up, such as may result from operation of monolithic manufacturing processes shown and described in the above referenced patent applications entitled "Method and System for Self-Replicating Manufacturing Stations" and "System and Method for Constraining Totally Released Microcomponents," is shown to include micro-translation system therein. Monolithic manufacturing processes utilized in providing micro-translation systems of the present invention may additionally or alternatively implement the fabrication processes disclosed in U.S. Pat. No. 4,740,410 issued to Muller et al. entitled "Micromechanical Elements and Methods for Their Fabrication," U.S. Pat. No. 5,660,680 issued to Keller entitled "Method for Fabrication of High Vertical Aspect Ratio Thin Film Structures," and/or U.S. Pat. No. 5,645,684 issued to Keller entitled "Multilayer High Vertical Aspect Ratio Thin Film Structures," the disclosures of which are hereby incorporated herein by reference.

Figure 5B:
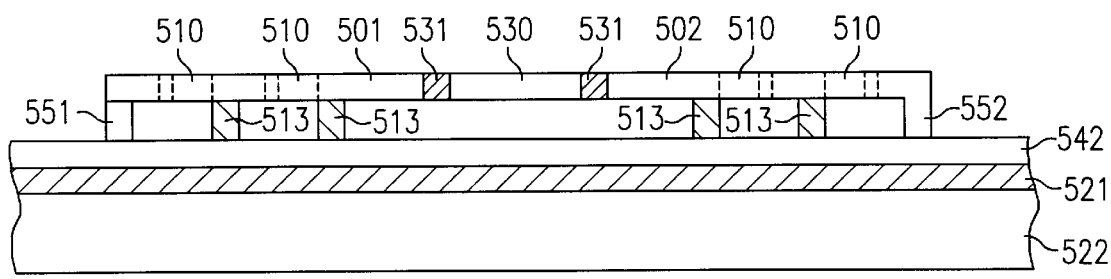
FIG. 5B shows an elevation view of the bi-directional micro-translation system of FIG. 5A.

It should be appreciated that the monolithic lay-up of FIG. 6 is illustrated to show features of micro-translation system 500 from a cross-sectional elevation view which, according to the preferred embodiment of FIGS. 5A and 5B, would not likely be visible in the same cross-section view. For example, brush 551 of the preferred embodiment of FIGS. 5A and 5B would be disposed in a plane more in the +Y direction (deeper into the page of the drawing) than brush 552 and, therefore, would typically not be visible in the cross-section represented. Similarly, bushings 513 of the preferred embodiment of FIGS. 5A and 5B would be disposed in a plane more in the +Y direction (deeper into the page of the drawing) than brush 552, although in a plane more in the −Y direction (less deep into the page of the drawing) than brush 551, and, therefore, would typically not be visible in the cross-section represented. However, the illustrative cross-sectional view is provided showing such components in order to aid the reader in understanding the monolithic lay-up of a preferred embodiment.

The monolithic lay-up of FIG. 6 includes conductive substrate 522 (e.g., a silicon "wafer") having disposed thereon insulator 521 (e.g., silicon nitride). Signal path 541 (not shown in FIG. 6) and signal path 542 may be provided in the lay-up by laying down a conductor layer and properly masking and etching the layer to result in the desired conductor patterns, as is discussed in more detail in the above referenced patent applications. Thereafter sacrificial release layer 611 (e.g., silicon oxide) may be provided in the monolithic lay-up to facilitate the release of micro-translation system 500 from other layers of the lay-up. Preferably a first device unit, such as may include one or more layers of the monolithic lay-up, is provided upon sacrificial release layer 611.

A conductive layer may be laid down on sacrificial release layer 611 for use in defining conductive components of a device unit of micro-translation system 500. For example, brushes 551 and 552 may be the result of properly masking and etching a conductive layer (e.g., polysilicon) laid down on sacrificial release layer 611. Similarly, an insulating layer (e.g., silicon nitride) may be laid down on sacrificial release layer 611 for use in defining non-conductive components of a device unit of micro-translation system 500. For example, bushings 513 may be the result of properly masking and etching an insulating layer laid down on sacrificial release layer 611. When desired components have been properly formed, sacrificial layer 612 (e.g., silicon oxide) is preferably laid down in the monolithic lay-up to thereby enable formation of additional layers of the monolithic lay-up forming the first device unit.

Additional components of the first device unit may be provided by laying down a layer of proper material and properly masking and etching the layer to define the desired components. For example, actuator arrays 501 and 502 and/or stage 530 may be defined from a conductive layer (e.g., polysilicon) deposited upon the above described resulting layer. Stage 530 as well as actuator array blanks corresponding to actuator arrays 501 and 502 may be formed from such a conductive layer by properly masking and etching the layer to result in actuator array blanks and stage 530. The actuator array blanks may be manipulated to result in actuator arrays 501 and 502, including SDAs 510 having plates 511 corresponding to bushings 513, by properly masking and etching the actuator array blanks. Additionally, the actuator array blanks may be configured to communicate with a corresponding one of brushes 551 and 552. Thereafter, portions of the device unit may be protected from application of additional operative layers of material, such as through application of sacrificial layer 613 to appropriate portions thereof, e.g., using the aforementioned masking and etching technique.

Actuator arrays 501 and 502 of the preferred embodiment are operatively coupled while maintaining electrical isolation. Accordingly, an insulating layer is preferably laid down in the monolithic stack-up of FIG. 6 to provide insulating members 531 disposed between actuator array 501 and stage 530 and between actuator array 502 and stage 530.

It should be appreciated that the monolithic lay-up of FIG. 6 is illustrative of that which may be utilized in manufacturing micro-translation systems of the present invention using monolithic processes and is not intended to limit the present invention to the particular layers disclosed therein. Accordingly, variations in the material used for particular layers and/or the order in which particular layers are laid down are within the scope of the present invention. Moreover, the present invention is not limited to monolithic production of the single device illustrated or even a single device layer as illustrated. For example, one of ordinary skill in the art will readily appreciate that masking and etching of device components may be scaled to produce a plurality of micro-translation systems of the present invention upon a single substrate in a single monolithic process. Additionally or alternatively, the above described preferred embodiment monolithic process may be scaled to include multiple device units, whether discretely disposed one upon another or interleaved, as is readily appreciable to one of ordinary skill in the art from the techniques described in laying down the above described layers.

Figure 7B:
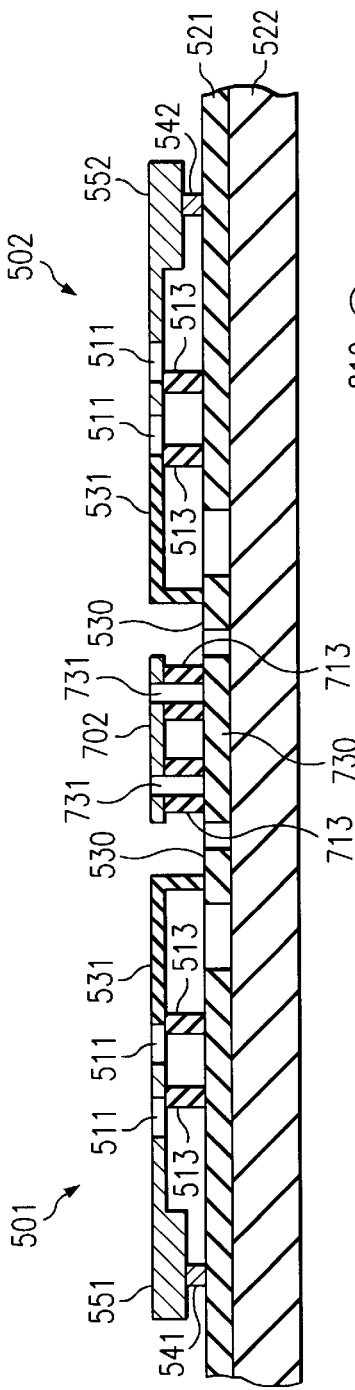
FIG. 7B shows an elevation view of the multiple axis micro-translation system of FIG. 7A.
Figure 7A:
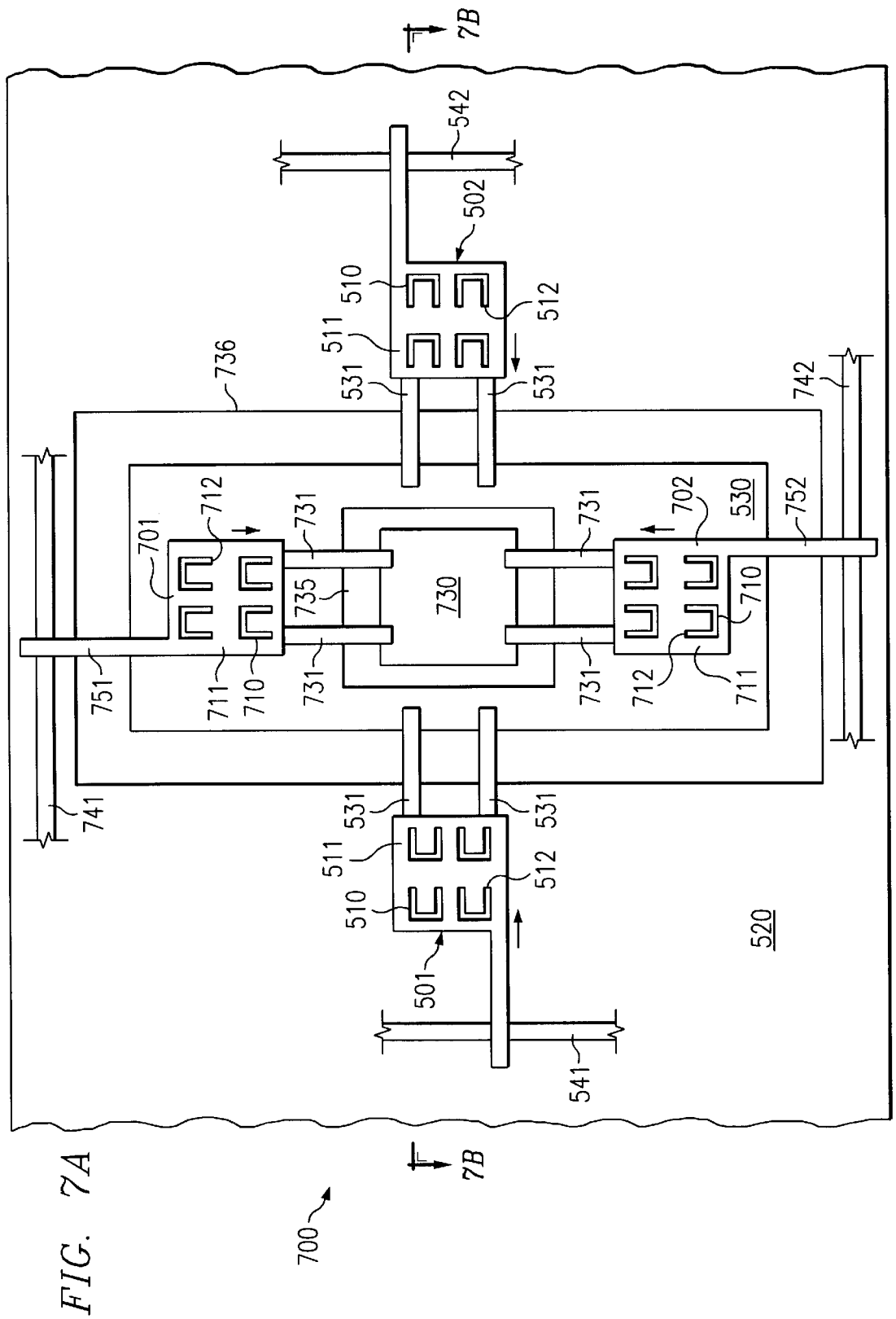
FIG. 7A shows a plan view of a multiple axis micro-translation system of the present invention.

Directing attention to FIG. 7A, a preferred embodiment of the present invention adapted to provide movement bi-directionally along both an X axis and a Y axis is shown in a plan view as micro-translation system 700. Micro-translation system 700 provides an embodiment in which a plurality of translation stages are interleaved to provide motion in different directions. Specifically, micro-translation system 700 includes actuator arrays 501 and 502 operatively coupled to stage 530 (collectively a first device unit) to controllably provide movement thereof bi-directionally along an X axis, substantially as described above with respect to micro-translation system 500 of FIGS. 5A and 5B. Additionally, micro-translation system 700 includes actuator arrays 701 and 702 operatively coupled to stage 730 (collectively a second device unit), interleaved with the stage of the first actuator arrays, to controllably provide movement thereof bi-directionally along a Y axis.

The embodiment of stage 530 illustrated in FIG. 7A has been adapted to accommodate a second stage interleaved therewith. Specifically, stage 530 includes orifice 735 through which stage 730 is disposed. Accordingly, stage 730 is free to move within orifice 735 under control of actuator stages 701 and 702. Preferably orifice 735 is sized and shaped to accommodate desired movement of stage 730 of the second device unit along the Y axis as provided by actuator arrays 701 and 702 according to the present invention.

Similarly, the illustrated embodiment of substrate 520 includes orifice 736 into which stage 530 is disposed. For example, substrate 520 may include an orifice as shown disposed in an insulating layer thereof, exposing a conducting layer therebelow, to accommodate stage 530, itself an insulating layer. Accordingly, stage 530 is free to move within orifice 736 under control of actuator stages 501 and 502. Preferably orifice 736 is sized and shaped to accommodate desired movement of stage 530 of the first device unit along the X axis as provided by actuator arrays 501 and 502 according to the present invention.

As with micro-translation system 500 of FIGS. 5A and 5B above, various actuators of micro-translation system 700 are preferably independently controllable to thereby allow selection of a direction of movement. Accordingly, in addition to the above described independent operation of actuator arrays 501 and 502 of the first device unit, micro-translation system 700 of the illustrated embodiment includes two actuator banks of the second device unit which are independently controllable to provide controlled movement of stage 730 in both the +Y and −Y directions. Specifically, SDAs 710 of actuator array 701 are preferably configured to provide motion in a first direction, such as the −Y direction, while SDAs 710 of actuator array 702 are preferably configured to provide motion in a second direction, such as the +Y direction. Accordingly, a specimen or microcomponent may be placed upon or otherwise put in communication with stage 730 for controlled translation in a ±X direction using actuator arrays 501 or 502 and in a ±Y direction using actuator arrays 701 and 702.

Independent control of actuators of the present invention is preferably provided through electrical isolation of various ones of the actuators. For example, although disposed upon a same device layer, SDAs 710 of actuator array 701 are preferably electrically isolated from SDAs 710 of actuator array 702, such as through the use of insulating members 731 disposed therebetween. Alternatively, actuator arrays 701 and 702 may be electrically isolated even where the members coupling the arrays to stage 730 are conductive through relying upon the insulating properties of a preferred embodiment stage 730 providing an insulating layer as described above. Accordingly, a control signal may be provided to SDAs 710 of actuator array 701, such as via signal path 741, while SDAs 710 of actuator array 702 remain inactive to thereby provide movement of stage 730 in the −Y direction. Similarly, a control signal may be provided to SDAs 710 of actuator array 702, such as via signal path 742, while SDAs 710 of actuator array 701 remain inactive to thereby provide movement of stage 730 in the +Y direction.

Actuators 710 of the second device unit are preferably electrically isolated from actuators 510 of the first device unit. Accordingly, stage 530 may be an insulating layer in the embodiment of FIG. 7A. Additionally or alternatively, insulating members 531 may be utilized to provide electrical isolation. It should be appreciated that according to the preferred embodiment, stage 530 is provided as an insulating layer not only to facilitate electrical isolation of the actuator arrays of the present invention, but further to provide an insulating layer upon which the actuators of the second device unit operate.

As with SDAs 510 of FIGS. 5A and 5B, SDAs 710 are preferably configured substantially as shown in FIG. 3 and, therefore, operate substantially as shown in FIGS. 4A–4C. Accordingly, preferred embodiment SDAs 710 include plate 711 (FIG. 7A) and bushing 713 (FIG. 7B) coupled thereto. Plates 711 of the illustrated embodiment are coupled to actuator arrays 701 and 702 by torsion mounts 712. For example, plates 711 of SDAs 710 may be defined from a solid layer of conductive material from which actuator array 701 and/or actuator array 702 are made by etching, or otherwise removing, material of the layer in order to define three sides of plates 711. Accordingly, torsion mounts 712 may be defined by, and substantially integral to, the interface of plates 711 and actuator arrays 701 and 702.

In operation according to a preferred embodiment, a voltage, as may be provided by voltage source such as voltage source 410 of FIGS. 4A–4C, is applied across plates 711 of the SDAs to be activated and a corresponding substrate conductor, such as conductor 522. For example, a first signal of the voltage source may be applied to plates 711 of actuator array 701 while a corresponding second signal of the voltage source is applied to conductor 522 to energize SDAs substantially as described above with respect to FIGS. 4A–4C. Preferably, stage 730 provides an insulating layer to electrically isolate plates 711 from substrate 522 during operation of SDAs 710. Rather than itself being an insulating layer, stage 730 may be coated with an insulating layer, according to an alternative embodiment.

Preferred embodiments of the invention are adapted to accommodate the application of control signals to selected components of micro-translation system 700 throughout the operational range thereof. Accordingly, as with micro-translation system 500 of FIGS. 5A and 5B, the illustrated embodiment includes signal paths 541 and 542 and brushes 551 and 552 associated with actuator arrays 501 and 502, respectively. Additionally, the illustrated embodiment preferably includes signal paths 741 and 742 and brushes 751 and 752 associated with actuator arrays 701 and 702, respectively. Brush 751 is preferably in electrical communication with actuator array 701 and is preferably disposed such that brush 751 is in electrical communication with at least a portion of signal path 741 throughout operational movement of micro-translation system 700. Similarly, brush 752 is preferably in electrical communication with actuator array 702 and is preferably disposed such that brush 752 is in electrical communication with at least a portion of signal path 742 throughout operational movement of micro-translation system 700. Accordingly, stage 730 may be controlled to move in either direction along the route of signal paths 741 and 742 while stage 530 may be controlled to move in either direction along the route of signal paths 541 and 542, thereby providing independently controllable movement in the ±X direction as well as the ±Y direction.

As with micro-translation system 500 of FIGS. 5A and 5B, it should be appreciated that micro-translation system 700 of the illustrated embodiment is well suited for production using monolithic production processes. For example, micro-translation system 700 of a preferred embodiment is configured so as to require no post-process manufacturing steps, such as to provide electrical isolation between various ones of the actuators and/or to couple actuator banks to a stage.

It should be appreciated that techniques in addition to or in the alternative to the signal path and sliding brush arrangement described above may be utilized according to the present invention to provide control signals throughout the operational movement of the micro-translation system. For example, spring tethers may be utilized, such as to couple signal path 741 to actuator array 701, to accommodate operational movement according to the present invention. Preferred embodiment spring tethers may be produced using a same monolithic process used in manufacturing a micro-translation system of the present invention. For example, monolithic manufacturing processes may be used to produce a coiled, accordinated, or other extendable length of conductive material (e.g., polysilicon).

Figure 8B:
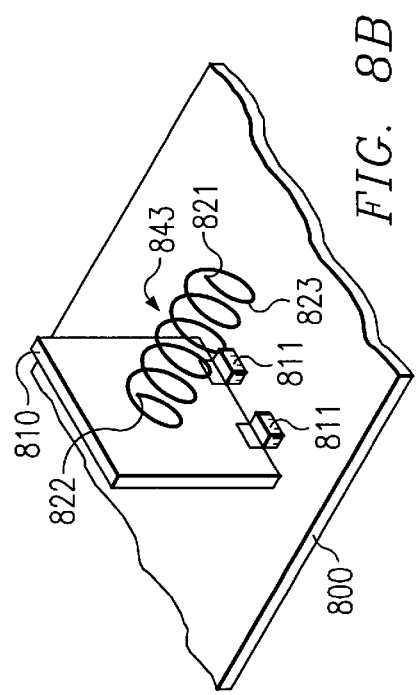
FIGS. 8A and 8B show a preferred embodiment implementation of a spring tether such as may be utilized with the micro-translation system of FIGS. 7A and 7B.
Figure 8A:
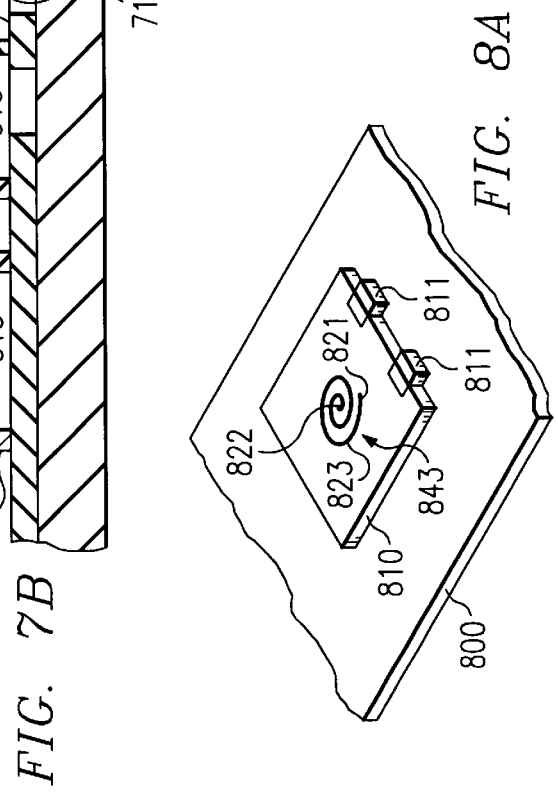

Directing attention to FIG. 8A, a monolithically produced preferred embodiment of spring tether 843 is illustrated. Specifically, according to the illustrated embodiment coil portion 823 of spring tether 843 is preferably monolithically produced on a sacrificial release layer (not shown) while proximal end 822 of spring tether 843 is disposed upon substrate 810. Accordingly, a signal path (not shown), for connecting to a signal source, may be laid down upon substrate 810 and electrically coupled to proximal end 822 of spring tether 843. Correspondingly, a signal path (not shown), may be laid down upon a sacrificial release layer and electrically coupled to distal end 821 of spring tether 843 and to a conductor portion of an actuator array or other portion of a signal path associated therewith. Upon removal of the sacrificial layer(s), spring tether 843 may be utilized in extending/retracting in response to movement of a micro-translation system of the present invention.

According to a preferred embodiment, substrate 810 is provided as a hinged panel to facilitate extension/retraction of spring tether 843 in correspondence to movement of a micro-translation system of the present invention. For example, the illustrated embodiment includes hinges 811, disposed upon substrate 800, to allow substrate 810 to move in correspondence to extension/retraction of spring tether 843.

Of course, all aspects of micro-translation systems of alternative embodiments of the present invention need not be monolithically produced. For example, a wire tether may be applied in a post-process manufacturing step rather than monolithically producing a spring tether according to an alternative embodiment of the present invention.

It should be appreciated that the micro-translation systems of the present invention are not limited to use of a particular actuator, such as the SDAs illustrated above. For example, embodiments of the present invention may utilize thermal actuators, if desired. Moreover, embodiments of the present invention may utilize a combination of different actuators in providing translation according to the present invention.

Figure 1:
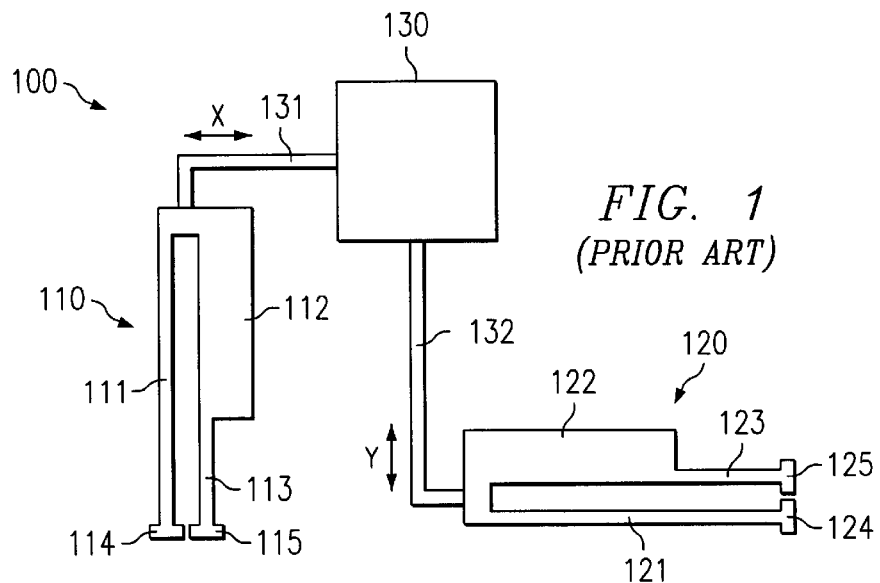
FIG. 1 shows a prior art micro-translation system using thermal actuators to provide translation along both the X and Y axes.
Figure 2:
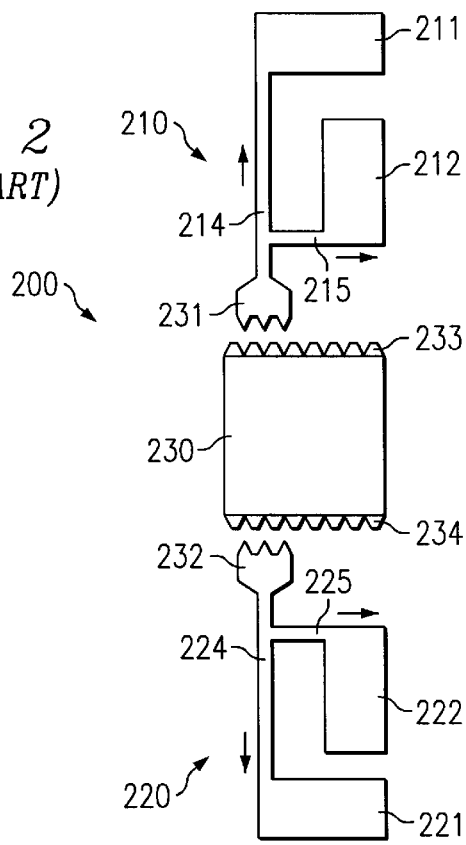
FIG. 2 shows a prior art unidirectional micro-translation system utilizing indirect drive means.
Figure 9:
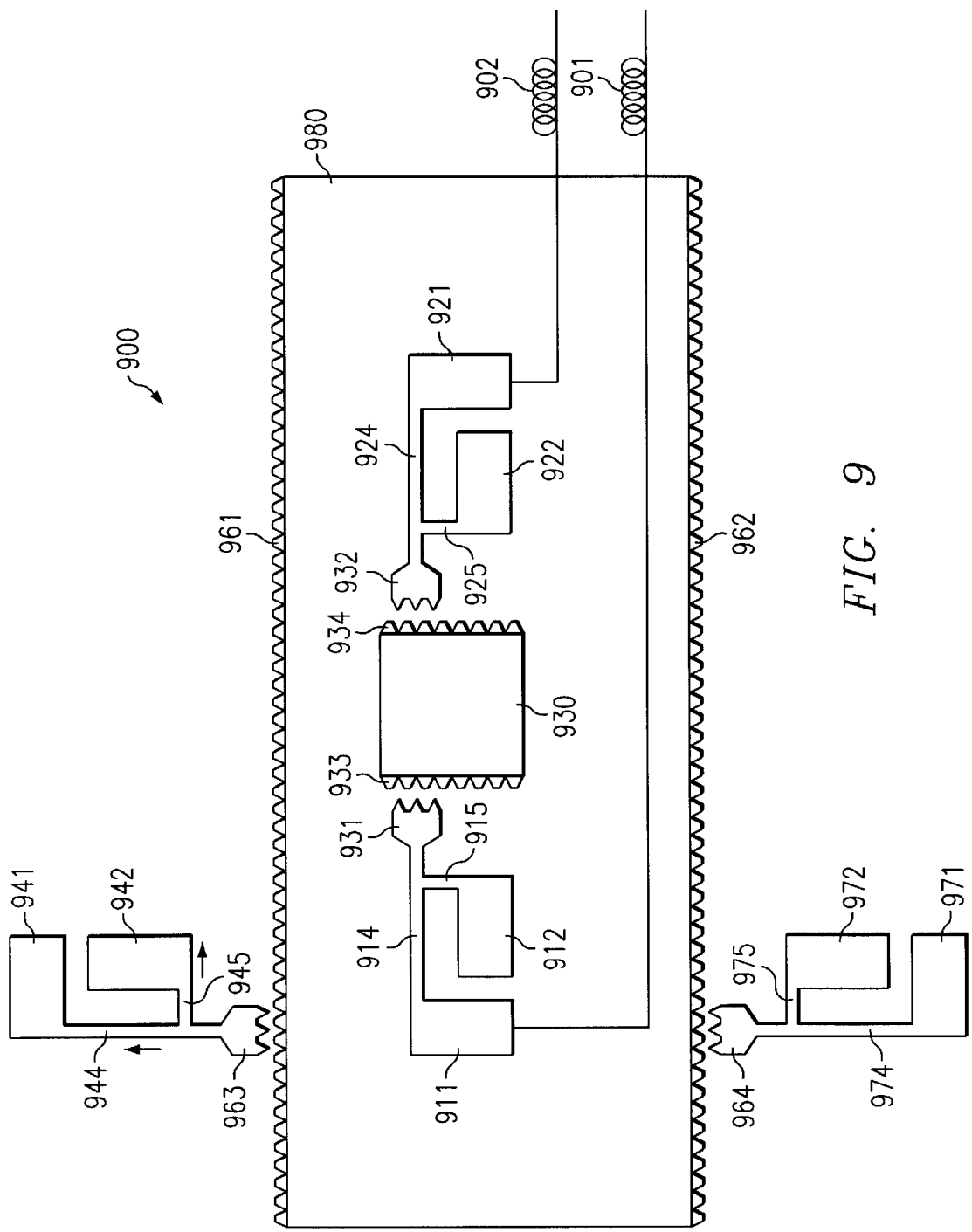
FIG. 9 shows a plan view of an alternative embodiment multiple axis micro-translation system of the present invention.

Directing attention to FIG. 9, an embodiment of the present invention adapted to provide movement along both the X and Y axes using banks of thermal actuators is shown as micro-translation system 900. Specifically, micro-translation system 900 includes a first device unit including an indirect drive translation system configured substantially as described above with respect to FIG. 2. Accordingly, a translation mechanism is preferably disposed on each side of, and in the same plane with, stage 980 to controllably engage stage 980 and provide translation in a predetermined direction. A first translation mechanism of the first device unit may include actuator banks 941 and 942 coupled to lateral translation gear 961 by connecting arms 944 and 945, respectively. Similarly, a second translation mechanism of the first device unit may include actuator banks 971 and 972 coupled to lateral translation gear 964 by connecting arms 974 and 975, respectively. Actuator banks 941, 942, 971, and 972 are preferably oriented to provide translation of stage 980, and components placed thereon, along the X axis by causing lateral translation gears 963 and 994 to engage corresponding racks 961 and 962.

Micro-translation system 900 includes a second device unit disposed upon stage 980. The second device unit includes an indirect drive translation system configured substantially as the indirect drive translation system of the first device unit. Accordingly, a translation mechanism is preferably disposed on each side of, and in the same plane with, stage 930 to controllably engage stage 930 and provide translation in a predetermined direction. A first translation mechanism of the second device unit may include actuator banks 911 and 912 coupled to lateral translation gear 931 by connecting arms 914 and 915, respectively. Similarly, a second translation mechanism of the second device unit may include actuator banks 921 and 922 coupled to lateral translation gear 932 by connecting arms 924 and 925, respectively. Actuator banks 911, 912, 921, and 922 are preferably oriented to provide translation of stage 930, and components placed thereon, along the Y axis by causing lateral translation gears 931 and 932 to engage corresponding racks 933 and 934.

Preferably micro-translation system 900 is adapted to accommodate the application of control signals to selected components throughout the movement range thereof. Accordingly, the illustrated embodiment includes signal paths laid down on stage 980 for providing signals to the translation mechanisms of the second device unit. For example, stage 980 may include an insulating layer, such as described above, upon which the desired signal paths are disposed. Spring tethers 901 and 902, such as may be configured as described above with respect to FIGS. 8A and 8B, are provided in the illustrated embodiment to accommodate movement of the stage 980 and allow control of the translation mechanisms of the second device unit throughout such movement.

Although the illustrated embodiment of FIG. 9 includes the use of spring tethers for providing control signals to the second device unit, it should be appreciated that alternative embodiments of the present invention may utilize other techniques for providing control signals to various actuators throughout the operational movement of the micro-translation system. For example, signal path tracks such as shown and described above with reference to FIGS. 5A, 5B, 7A, and 7B may be laid down upon a substrate below stage 980 and an arrangement of brushes and signal paths utilized to couple the translation mechanisms of the second device unit thereto.

Figure 10:
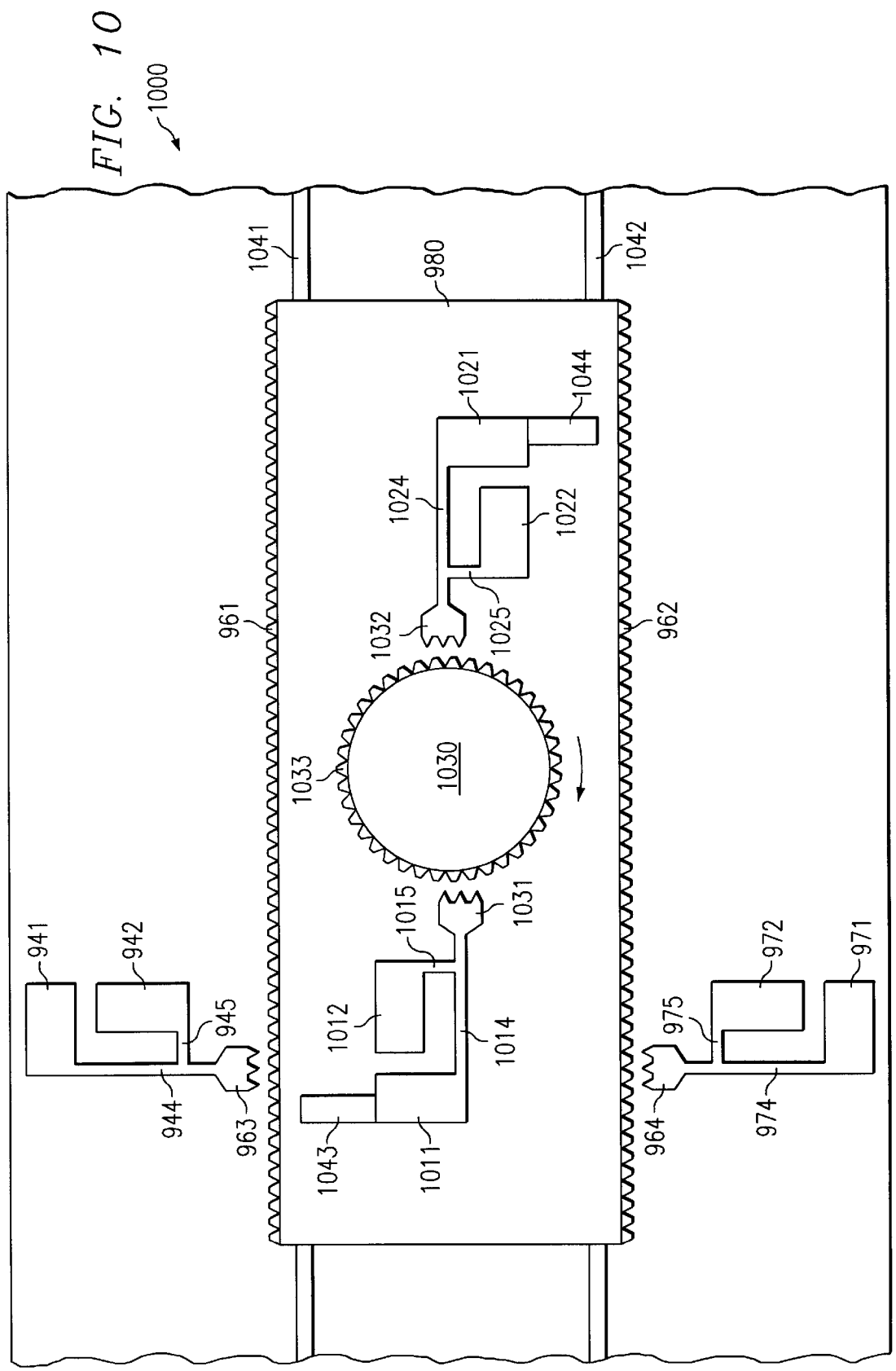
FIG. 10 shows a plan view of an alternative embodiment micro-translation system of the present invention providing both linear and rotational translation.

Directing attention to FIG. 10, an alternative embodiment of the present invention wherein a second device unit provides rotational movement rather than linear movement is shown as micro-translation system 1000. Specifically, micro-translation system 1000 includes a first device unit, providing movement along the X axis as described above, and a second device unit disposed upon stage 980 of the first device unit. The second device unit includes an indirect drive translation system configured to provide rotational translation. Accordingly, a translation mechanism is preferably disposed on each side of, and in the same plane with, stage 1030 to controllably engage stage 1030 and provide translation in a predetermined direction. A first translation mechanism of the second device unit may include actuator banks 1011 and 1012 coupled to rotational translation gear 1031 by connecting arms 1014 and 1015, respectively. Similarly, a second translation mechanism of the second device unit may include actuator banks 1021 and 1022 coupled to rotational translation gear 1032 by connecting arms 1024 and 1025, respectively. Actuator banks 1011, 1012, 1021, and 1022 are preferably oriented to provide translation of stage 1030, and components placed thereon, in a circular motion by causing rotational translation gears 1031 and 1032 to engage corresponding ring gear 1033.

Preferably micro-translation system 1000 is adapted to accommodate the application of control signals to selected components throughout the movement range thereof. Accordingly, the illustrated embodiment includes signal paths 1043 and 1044 laid down on stage 980 for providing signals to the translation mechanisms of the second device unit. For example, stage 980 may include an insulating layer, such as described above, upon which the desired signal paths are disposed. Signal paths 1041 and 1042, corresponding to signal paths 1043 and 1044 respectively are preferably laid down upon a substrate below stage 980 and an arrangement of brushes and signal paths utilized to couple the translation mechanisms of the second device unit thereto, such as described above with respect to the embodiments of FIGS. 5A, 5B, 7A, and 7B to allow control of the translation mechanisms of the second device unit throughout operational movement of micro-translation system 1000.

Figure 11:
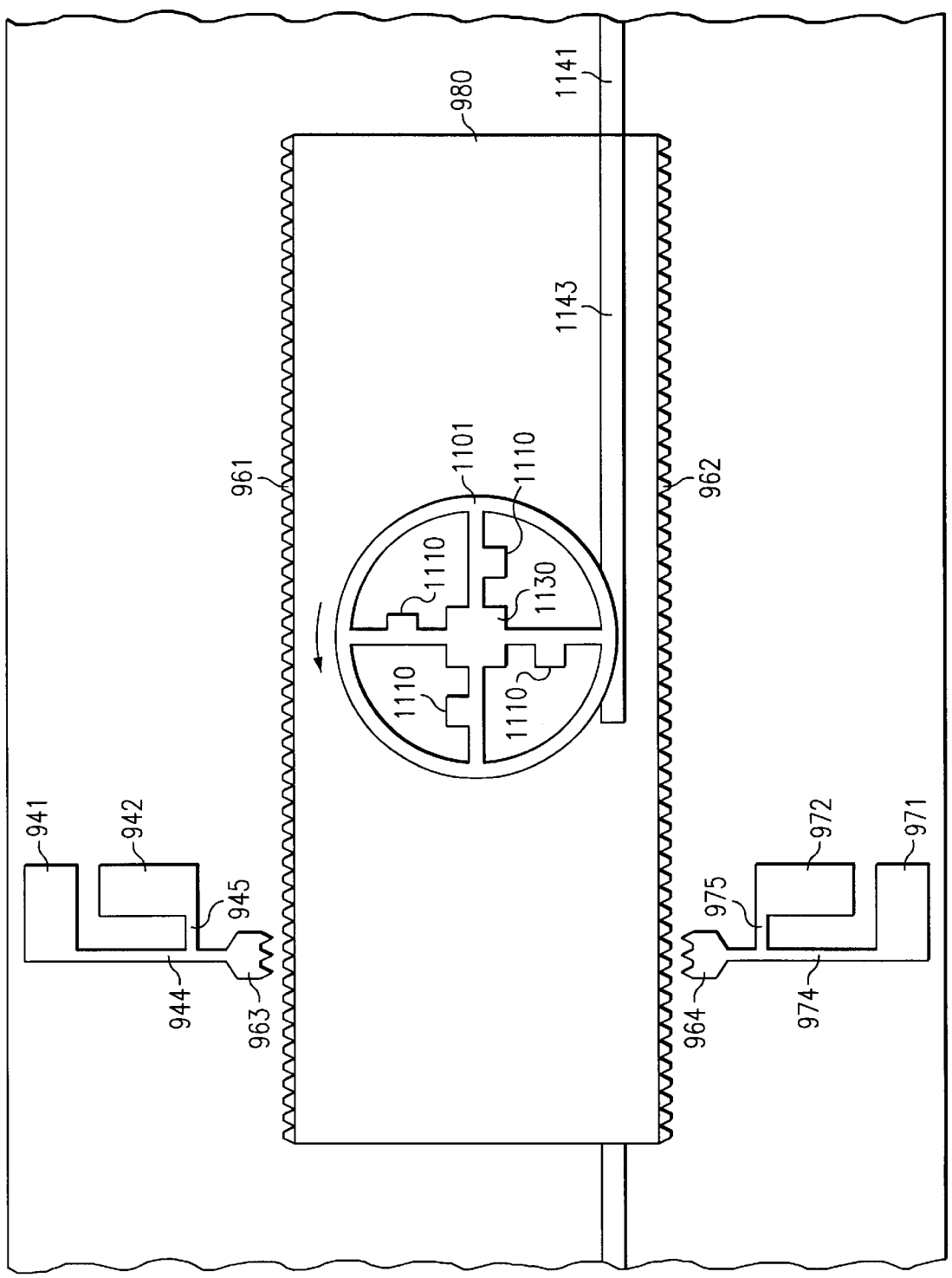
FIG. 11 shows a plan view of another alternative embodiment micro-translation system of the present invention providing both linear and rotational translation.

Directing attention to FIG. 11, another alternative embodiment of the present invention wherein a second device unit provides rotational movement rather than linear movement is shown as micro-translation system 1100. Specifically, micro-translation system 1100 includes a first device unit, providing movement along the X axis as described above, and a second device unit disposed upon stage 980 of the first device unit. The second device unit includes an SDA drive translation system configured to provide rotational translation. Accordingly, an actuator bank comprises SDAs 1110 to controllably provide translation of stage 1130 in a predetermined direction. The SDAs of the actuator bank are preferably disposed radially about stage 1130 to provide translation of stage 1130, and components placed thereon, in a circular motion by each stepping spokes of support structure 1101 in a same direction.

Preferably micro-translation system 1100 is adapted to accommodate the application of control signals to selected components throughout the movement range thereof. Accordingly, the illustrated embodiment includes signal path 1143 laid down on stage 980 for providing signals to the translation mechanisms of the second device unit. For example, stage 980 may include an insulating layer, such as described above, upon which a desired signal path is disposed. Signal path 1141, corresponding to signal path 1143 is preferably laid down upon a substrate below stage 980 and an arrangement of brushes and signal paths utilized to couple the translation mechanisms of the second device unit thereto, such as described above with respect to the embodiments of FIGS. 5A, 5B, 7A, and 7B to allow control of the translation mechanisms of the second device unit throughout operational movement of micro-translation system 1100.

Figure 12:
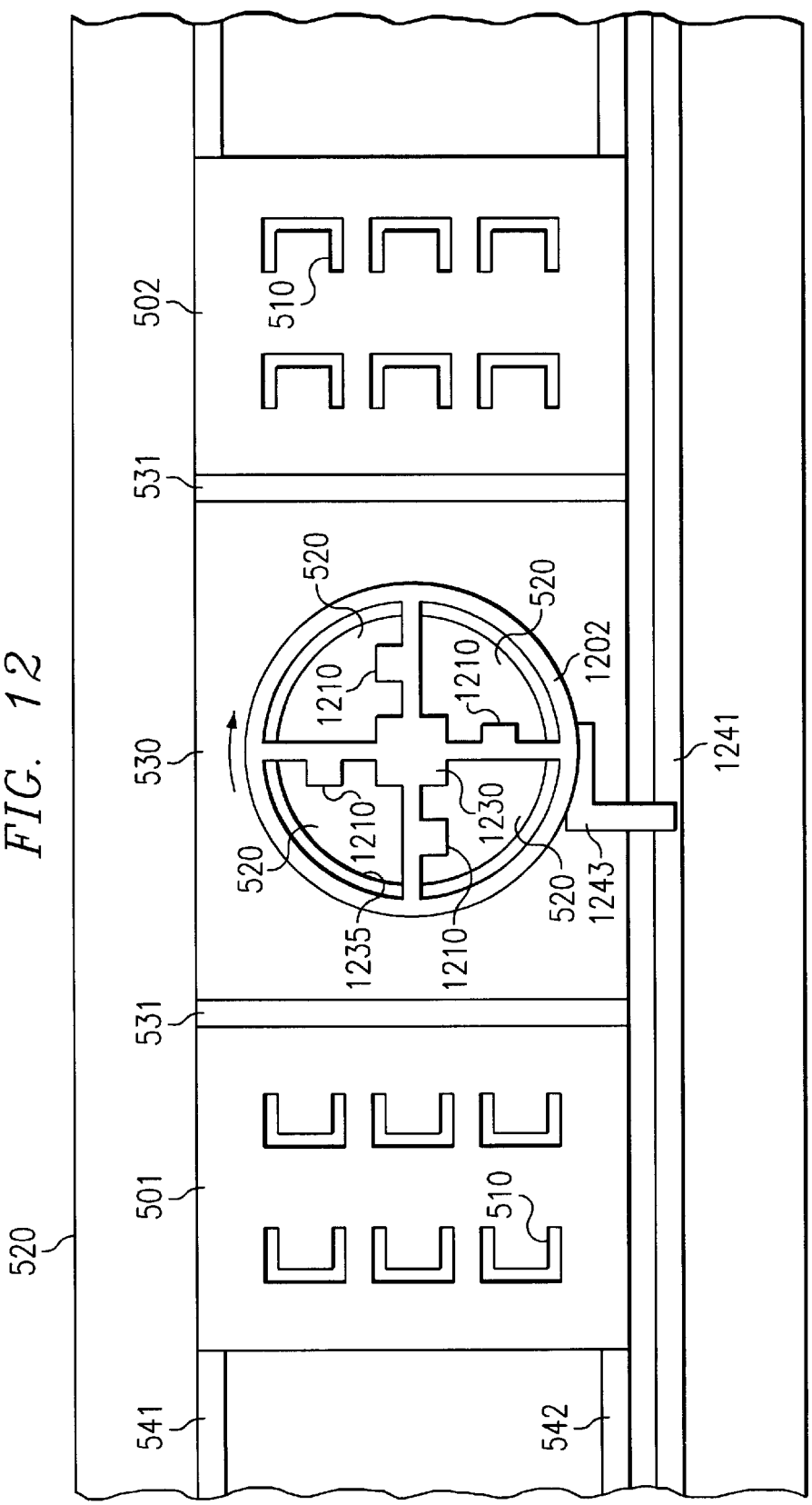
FIG. 12 shows a plan view of another alternative embodiment micro-translation system of the present invention providing both linear and rotational translation.

Directing attention to FIG. 12, an alternative embodiment of the present invention wherein a second device unit provides rotational movement rather than linear movement is shown as micro-translation system 1200. Specifically, micro-translation system 1200 includes a first device unit, providing movement along the X axis using SDAs as described above with respect to FIGS. 5A, 5B, 7A, and 7B, and a second device unit disposed to be interleaved with stage 980 of the first device unit. The second device unit includes an SDA drive translation system configured to provide rotational translation. Accordingly, an actuator bank preferably comprises SDAs 1210 to controllably provide translation of stage 1230 in a predetermined direction. The SDAs of the actuator bank are preferably disposed radially about stage 1230 to provide translation of stage 1230, and components placed thereon, in a circular motion by each stepping spokes of support structure 1201 in a same direction. Preferably, bushings of SDAs 1210 are disposed to be in communication with substrate 520 through orifice 1235, substantially as described above with respect to the second device unit SDAs of FIGS. 7A and 7B.

Preferably micro-translation system 1200 is adapted to accommodate the application of control signals to selected components throughout the movement range thereof. Accordingly, the illustrated embodiment includes signal path 1243 laid down on stage 530 for providing signals to the translation mechanisms of the second device unit. For example, stage 530 may include an insulating layer, such as described above, upon which the desired signal paths are disposed. Signal path 1241 corresponding to signal path 1243 is preferably laid down upon substrate 520 and an arrangement of brushes and signal paths utilized to couple the translation mechanisms of the second device unit thereto, such as described above with respect to the embodiments of FIGS. 5A, 5B, 7A, and 7B. Similarly, support structure 1201 preferably includes a brush or brushes disposed to contact a portion of signal path 1243, such as may be laid down on stage 530 to circle orifice 1253. The preferred embodiment configuration of signal paths allows control of the translation mechanisms of the second device unit throughout operational movement of micro-translation system 1200.

As with micro-translation system 500 of FIGS. 5A and 5B and micro-translation system 700 of FIGS. 7A and 7B, it should be appreciated that the above described micro-translation systems are well suited for production using monolithic production processes. Accordingly, each of the above micro-translation systems may be manufactured without the use of post-process manufacturing steps, such as to provide electrical isolation between various ones of the actuators, to couple actuator banks to a stage, and/or to connect a wire tether thereto to provide control signals throughout the operational movement of the micro-translation system, if desired.

Although various configurations of embodiments of the present invention have been shown herein, it should be appreciated that the invention is not limited to the specific embodiments shown. For example, particular implementations may be provided without the use of banks of actuators and, instead, utilize single actuators for translation, if desired. Likewise, various combinations of actuators may be utilized in providing movement in different directions by a micro-translation system of the present invention.

The present invention is not limited to actuators providing movement in the particular directions illustrated. For example, the actuators of a particular portion of a device unit may be disposed to provide a pulling force to a stage being translated rather than a pushing force as illustrated. Similarly, the present invention is also not limited to configurations providing the particular directions of movement shown. Accordingly, a linear scratch drive stage may be configured to provide unidirectional motion and/or a rotational scratch drive stage may be configured to provide bi-directional motion, if desired. Moreover, it should be appreciated that movement provided according to the present invention is not limited to linear and/or rotational as shown. For example, scratch drive actuator signal path tracks may be laid down in a curvilinear pattern in an embodiment providing motion in a corresponding pattern.

It should be appreciated that microcomponent translation provided by micro-translation systems of the present invention may be utilized for any of a number of purposes. For example, as micro-translator systems of the present invention are adapted for relatively large ranges of movement, micro-translator systems of the present invention are better adapted for use in microdevice manufacturing processes than are prior art translation systems having a very limited range of movement primarily designed for slight adjustment to a component within a system. Accordingly, a microcomponent may be disposed upon a stage of a micro-translation system of the present invention and be provided controlled movement in multiple directions, such as in the ±X, ±Y, and/or ±θ (rotational translation), for assembly of a microdevice therefrom.

Although the use of a stage for carrying a microcomponent has been described herein, it should be appreciated that the present invention is not so limited. For example, a microcomponent may be formed as a part of device stage rather than using the aforementioned stage to carry such a microcomponent. Of course, a microcomponent may be formed using the same monolithic process used in forming a micro-translation system of the present invention such that once all sacrificial layers are removed the microcomponent is disposed upon a stage of the micro-translation system, if desired.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A microcomponent translation system providing independently controllable movement in a plurality of directions, said system comprising:
    a first microdevice unit including
        at least a first actuator disposed to provide movement in a first direction of said plurality of directions,
        at least a second actuator disposed to provide movement in a second direction of said plurality of directions, wherein said at least a second actuator is independently controllable, and
        a first insulator disposed between said first actuator and said second actuator and providing mechanical communication therebetween, wherein said first insulator provides electrical isolation with respect to said first actuator and said second actuator, wherein movement of said at least a first actuator in the first direction results in corresponding movement in the first direction by said at least a second actuator while said at least a second actuator remains inactive, wherein after removing said first microdevice unit from a monolithic lay-up, providing a control signal to the first actuator to move said first microdevice unit in the first direction, and providing a control signal to the second actuator to move said first microdevice in the second direction, wherein control of said first actuator to move said first microdevice unit in said first direction and control of said second actuator to move said first microdevice unit in said second direction is independent.

2. The system of claim 1, wherein said first actuator and said second actuator comprise scratch drive actuators.

3. The system of claim 1, wherein said first actuator and said second actuator comprise thermal actuators.

4. The system claim 1, further comprising a first signal feed network adapted to provide a control signal to said first actuator throughout an operational range of movement of said first microdevice unit and a second signal feed network adapted to provide a control signal to said second actuator throughout said operational range of movement of said first microdevice unit.

5. The system of claim 4, wherein said operational range of movement of said first microdevice unit is in excess of approximately 50 microns.

6. The system of claim 4, wherein said first signal feed network comprises a first signal path disposed upon a substrate over which said first microdevice unit moves and a brush coupled to said first actuator disposed to contact said first signal path throughout said operational range of said first microdevice unit, and wherein said second signal feed network comprises a second signal path disposed upon a substrate over which said first microdevice unit moves and a brush coupled to said second actuator disposed to contact said second signal path throughout said operational range of said first microdevice unit.

7. The system of claim 4, wherein said first signal feed network comprises a first spring tether, and wherein said second signal feed network comprises a second spring tether.

8. The system of claim 1, wherein said first microdevice unit further includes a first stage in mechanical communication with said first actuator and said second actuator.

9. The system of claim 8, wherein said first insulator comprises said first stage.

10. The system of claim 8, wherein said first stage is disposed between said first actuator and said second actuator, and wherein said first insulator is disposed between said first stage and at least one of said first actuator and said second actuator.

11. The system of claim 10, wherein said first microdevice unit further includes a second insulator disposed between said first actuator and said second actuator and providing mechanical communication therebetween, wherein said second insulator is disposed between said first stage and at least one of said first actuator and said second actuator.

12. The system of claim 8, further comprising:
a second microdevice unit including a third actuator disposed to provide movement in a third direction of said plurality of directions, wherein at least a portion of said second microdevice unit is supported by said first stage.

13. The system of claim 12, wherein said third actuator comprises a scratch drive actuator.

14. The system of claim 13, wherein said second microdevice unit is interleaved with said first microdevice unit such that at least a portion of said second microdevice unit is disposed in a same plane as a corresponding portion of said first microdevice unit.

15. The system of claim 12, wherein said third actuator comprises a thermal actuator.

16. The system of claim 12, wherein said second microdevice unit further includes a fourth actuator disposed to provide movement in a fourth direction of said plurality of directions and a third insulator disposed between said third actuator and said fourth actuator and providing mechanical communication therebetween, wherein said third insulator provides electrical isolation with respect to said third actuator and said fourth actuator.

17. The system of claim 16, wherein said second microdevice unit further includes a second stage in mechanical communication with said third actuator and said fourth actuator.

18. The system of claim 17, wherein said second stage is disposed between said third actuator and said fourth actuator, and wherein said third insulator is disposed between said second stage and at least one of said third actuator and said fourth actuator.

19. The system of claim 18, wherein said second microdevice unit further includes a fourth insulator disposed between said third actuator and said fourth actuator and providing mechanical communication therebetween, wherein said fourth insulator is disposed between said second stage and at least one of said third actuator and said fourth actuator.

20. The system of claim 17, wherein said first microdevice unit provides movement of said first stage and said second stage along an X axis and said second microdevice unit provides movement of said second stage along a Y axis.

21. The system of claim 20, wherein said first stage and said second stage are disposed in a same plane.

22. The system of claim 12, wherein said first microdevice unit provides movement along an X axis and said second microdevice unit provides movement along a Y axis.

23. The system of claim 12, wherein said first microdevice unit provides substantially linear movement and said second microdevice unit provides substantially rotational movement.

24. The system of claim 12, further comprising a third signal feed network adapted to provide a control signal to said third actuator throughout an operational range of movement of said first microdevice unit and said second microdevice unit.

25. A microcomponent translation system providing independently controllable movement in a plurality of directions, said system comprising:
a first microdevice unit for providing controlled movement in a first direction; and
a second microdevice unit for providing controlled movement in a second direction, wherein control of said second microdevice unit is independent of control of said first microdevice unit, wherein said second microdevice unit is moved in said first direction by operation of said first microdevice unit while the second microdevice unit remains inactive, wherein after removing said first microdevice unit from a monolithic lay-up, providing a control signal to a first actuator to move said first microdevice unit in the first direction, and providing a control signal to a second actuator to move said first microdevice in a third direction, wherein control of said first actuator to move said first microdevice unit in said first direction and control of said second actuator to move said first microdevice unit in said third direction is independent.

26. The system of claim 25, wherein said second microdevice unit is at least in part disposed on a surface of said first microdevice unit.

27. The system of claim 26, wherein said second microdevice unit is disposed upon a stage portion of said first microdevice unit.

28. The system of claim 26, wherein said second microdevice unit is interleaved with said first microdevice unit.

29. The system of claim 26, wherein said first microdevice unit and said second microdevice unit are disposed in a same monolithic lay-up.

30. The system of claim 25, wherein said first microdevice unit comprises two material strata.

31. The system of claim 30, wherein said second microdevice unit comprises two material strata.

32. The system of claim 31, wherein said two material strata include an insulating material stratum and a conducting material stratum.

33. The system of claim 25, wherein said first microdevice unit provides substantially linear movement in said first direction.

34. The system of claim 33, wherein said second microdevice unit provides substantially linear movement in said second direction.

35. The system of claim 33, wherein said second microdevice unit provides substantially radial movement in said second direction.

36. The system of claim 25, wherein said controlled movement of said first microdevice is bi-directional, wherein said first direction comprises a direction of said bi-directional movement.

37. The system of claim 36, wherein said controlled movement of said second microdevice is bi-directional, wherein said second direction comprises a direction of said bi-directional movement.

38. The system of claim 25, wherein said first microdevice unit comprises a first scratch drive actuator.

39. The system of claim 38, wherein said first microdevice unit comprises a second scratch drive actuator, wherein said first scratch drive actuator and said second scratch drive actuator are electrically isolated at least in part by an insulator of said first microdevice unit.

40. The system of claim 25, wherein said first microdevice unit comprises a first thermal actuator.

41. The system of claim 40, wherein said first microdevice unit comprises a second thermal actuator, wherein said first thermal actuator and said second thermal actuator are electrically isolated by an insulator of said first microdevice unit.

42. The system of claim 25, wherein said second microdevice unit comprises a third scratch drive actuator.

43. The system of claim 42, wherein said second microdevice unit comprises a fourth scratch drive actuator, wherein said third scratch drive actuator and said fourth scratch drive actuator are electrically isolated by an insulator of said second microdevice unit.

44. The system of claim 42, wherein said third scratch drive actuator is electrically isolated from an actuator of said first microdevice unit by an insulator disposed between said first microdevice unit and said second microdevice unit.

45. The system of claim 25, wherein said second microdevice unit comprises a third thermal actuator.

46. The system of claim 45, wherein said second microdevice unit comprises a fourth thermal actuator, wherein said third thermal actuator and said fourth thermal actuator are electrically isolated by an insulator of said second microdevice unit.

47. The system of claim 45, wherein said third thermal actuator is electrically isolated from an actuator of said first microdevice unit by an insulator disposed between said first microdevice unit and said second microdevice unit.

48. The system of claim 25, further comprising:
a signal feed path providing a control signal to said second microdevice unit throughout an operational range of movement of said first microdevice unit and said second microdevice unit.

49. A method for providing positioning of microcomponents, said method comprising:
providing a first translation stage of a first device unit;
providing a second translation stage of a second device unit;
electrically isolating a first actuator of said first device unit and an actuator of said second device unit;
providing a control signal to said actuator of said first device unit to move said first translation stage in a first direction, wherein movement of said first translation stage results in a corresponding movement in said second translation stage;
providing a control signal to said actuator of said second device unit to move said second translation stage in a second direction, wherein movement of said second translation stage is free of corresponding movement in said first translation stage; and
after removing said first device unit from a monolithic lay-up, providing a control signal to said first actuator to move said first device unit in the first direction, and providing a control signal to a second actuator to move said first device in a third direction, wherein control of said first actuator to move said first device unit in said first direction and control of said second actuator to move said first device unit in said third direction is independent.

50. The method of claim 49, further comprising:
manufacturing said first device unit and said second device unit in a same monolithic lay-up.

51. The method of claim 50, wherein said manufacturing said first device unit and said second device unit comprises:
laying down a sacrificial stratum between a substrate and strata of said first device unit and said second device unit, wherein a stratum of said first device unit and a stratum of said second device unit are laid down in direct communication with said sacrificial stratum.

52. The method of claim 51, wherein said manufacturing said first device unit and said second device unit further comprises:
removing at least a portion of said first sacrificial stratum to allow independent movement of said first device unit and said second device unit.

53. The method of claim 50, wherein said manufacturing said first device unit and said second device unit comprises:
forming a spring tether coupled to said actuator of said second device unit.

54. The method of claim 53, wherein said manufacturing said first device unit and said second device unit further comprises:
providing a hinged substrate coupled to said spring tether.

55. The method of claim 49, wherein said movement in said first direction comprises substantially linear movement along an X axis and said movement in said second direction comprises substantially linear movement along a Y axis.

56. The method of claim 49, wherein said movement in at least one of said first direction and said second direction comprises substantially linear movement and said movement in the other one of said first direction and said second direction comprises substantially rotational movement.

57. The method of claim 49, further comprising:
electrically isolating said actuator of said first device unit and another actuator of said first device unit; and
providing a control signal to said another actuator of said first device unit to move said first translation stage in a third direction.

58. The method of claim 57, wherein said electrically isolating said actuator of said first device unit and said another actuator of said first device unit comprises:
providing insulating material between said actuator of said first device unit and said another actuator of said first device unit.

59. The method of claim 49, further comprising:
electrically isolating said actuator of said second device unit and another actuator of said second device unit; and
providing a control signal to said another actuator of said second device unit to move said second translation stage in a fourth direction.

60. The method of claim 59, wherein said electrically isolating said actuator of said second device unit and said another actuator of said second device unit comprises:
providing insulating material in between said actuator of said second device unit and said another actuator of said second device unit.

61. The method of claim 49, wherein said actuator of said first device unit comprises a scratch drive actuator.

62. The method of claim 61, wherein said actuator of said second device unit comprises a scratch drive actuator.

63. The method of claim 61, wherein said actuator of said second device unit comprises a thermal actuator.

64. The method of claim 49, wherein said actuator of said first device unit comprises a thermal actuator.

65. The method of claim 64, wherein said actuator of said second device unit comprises a thermal actuator.

66. The method of claim 64, wherein said actuator of said second device unit comprises a scratch drive actuator.

67. A method for providing positioning of microcomponents, said method comprising:

monolithically laying-up a first device unit;

monolithically laying-up a second device unit, wherein said first device unit and said second device unit are laid-up in a same monolithic lay-up;

providing electrical isolation of an actuator of said first device unit and an actuator of said second device unit;

after removing said first device unit from said monolithic lay-up providing a control signal to said actuator of said first device unit to move said first translation stage in a first direction, wherein movement of said first translation stage results in a corresponding movement in said second translation stage in said first direction; and after removing said second device unit from said monolithic lay-up providing a control signal said actuator of said second device unit to move said second translation stage in a second direction, wherein movement of said second translation stage is free of corresponding movement in said first translation stage.

68. The method of claim 67, wherein said second device unit is disposed on top of said first device unit after removing said first device unit and said second device unit from said monolithic lay-up.

69. The method of claim 67, wherein said second device unit is interleaved with said first device unit after removing said first device unit and said second device unit from said monolithic lay-up.

70. A method for providing positioning of microcomponents, said method comprising:

monolithically laying-up a first device unit, wherein said first device unit includes a first actuator associated with first device unit movement in a first direction and a second actuator associated with first device movement in a second direction; and providing electrical isolation of said first actuator and said second actuator, wherein said electrical isolation is provided by an insulating material deposited in a monolithic lay-up of said first device unit in a same stratum as at least a portion of said first actuator and said second actuator;

after removing said first device unit from said monolithic lay-up providing a control signal to said first actuator to move said first device unit in a first direction, and providing a control signal to said second actuator to move a first translation stage in a second direction, wherein control of said first actuator to move said first device unit in said first direction and control of said second actuator to move said first device unit in said second direction is independent.

71. The method of claim 70, further comprising:

monolithically laying-up a second device unit in said monolithic lay-up, wherein said second device unit includes a third actuator associated with second device unit movement in a third direction; and providing electrical isolation of said third actuator and said first and second actuators, wherein said electrical isolation is provided at least in part by an insulating material deposited in said monolithic lay-up between said first device unit and said second device unit.

* * * * *